United States Patent [19]

Brucker

[11] Patent Number: 4,506,820

[45] Date of Patent: Mar. 26, 1985

[54] DESOLDERING DEVICE

[76] Inventor: John P. Brucker, 49 Timber Ridge, Los Alamos, N. Mex. 87544

[21] Appl. No.: 518,748

[22] Filed: Jul. 29, 1983

[51] Int. Cl.³ .............................................. B23K 3/00
[52] U.S. Cl. .................................... 228/39; 228/56.1; 118/406
[58] Field of Search ................... 228/214, 264, 19, 39, 228/56 A, 40; 219/85 R, 85 D, 86.24; 118/504, 505, 406; 148/22

[56] References Cited

U.S. PATENT DOCUMENTS 2,964,007 12/1960 Buffington .......................... 113/126
3,815,806 6/1974 Paxton ................................. 228/19

FOREIGN PATENT DOCUMENTS 1469685 9/1977 United Kingdom ................ 118/406

Primary Examiner—Gene P. Crosby
Assistant Examiner—C. McKee

[57] ABSTRACT

An apparatus for desoldering and soldering multipin components to or from printed circuit boards is described. A shallow large area solder pot, surrounded by a recessed area to catch overflow, in combination with a flexible mask is used to apply molten solder to a selected area of a printed circuit board to desolder or solder a selected device.

9 Claims, 3 Drawing Figures

DESOLDERING DEVICE

BACKGROUND OF THE INVENTION

This invention relates to an apparatus for removing and replacing multipin devices soldered to printed circuit boards. Removing and replacing multipin devices such as integrated circuits, relays and connectors has been a slow and tedious process. Most often, it is done using a soldering iron and braided wick to remove the solder by capillary action, or with a vacuum soldering iron to melt the solder and suck it out of each joint in a sequential manner. These methods have been only marginally successful. A high degree of skill is required to prevent damage to the printed circuit board from excess heat and mechanical damage. The device being removed is usually ruined and the printed circuit board is frequently damaged with lands or runs being lifted from the board from excess heat.

A number of attempts have been made to simplify this removal and replacement process. These attempts have been partially successful by applying heat to all pins of a device simultaneously thereby allowing its removal. Refer to U.S. Pat. Nos. 3,649,809 and 3,815,806 for descriptions of two such devices. These devices have had only limited success because they are restricted to relatively small devices and each different device geometry requires a different tool to fit its geometry.

SUMMARY OF THE INVENTION

It is an object of this invention to provide an apparatus that can remove and replace large and small multipin devices with only simple changes. A shallow large area solder pot is provided that is sorrounded by a recessed area to catch overflow. Masks are provided with various cutouts to match the pin geometries of various devices. The mask material is such that masks can be readily cut with a sharp knife to match any geometry.

In use, a mask is placed in contact with the bottom side of a printed circuit board to expose the pins of the device to be removed. The combination of circuit board and mask is then placed on top of the solder pot to allow solder to flow through the mask and contact the pins of the device. After the molten solder has melted all of the bond joints the device is removed and the board and mask are lifted from the solder pot.

Insertion of a new device is accomplished by first placing the board and mask combination in contact with the solder pot to melt the solder in the holes that will accept the new device. After the solder is melted the device is placed in the board through the molten solder holes and allowed to remain in the solder for several seconds to heat the device leads sufficiently to flow solder between the leads and the board holes. Commercial soldering oil and flux may be used to eliminate bridging and icicling problems that can occur on printed circuit boards. Dip soldering techniques are well known in the electronics field. Manufacturers of solder and solder chemicals can recommend solder alloys, fluxes and oils that will give consistent acceptable solder joints.

DESCRIPTION OF A PREFERRED EMBODIMENT

Figure 1:
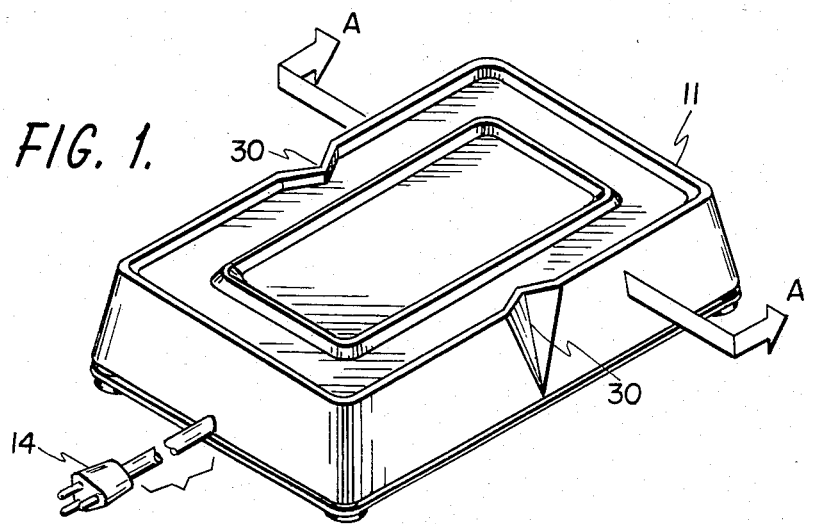
FIG. 1 is an isometric view of the shallow solder pot with its sorrounding recessed area.
Figure 2:
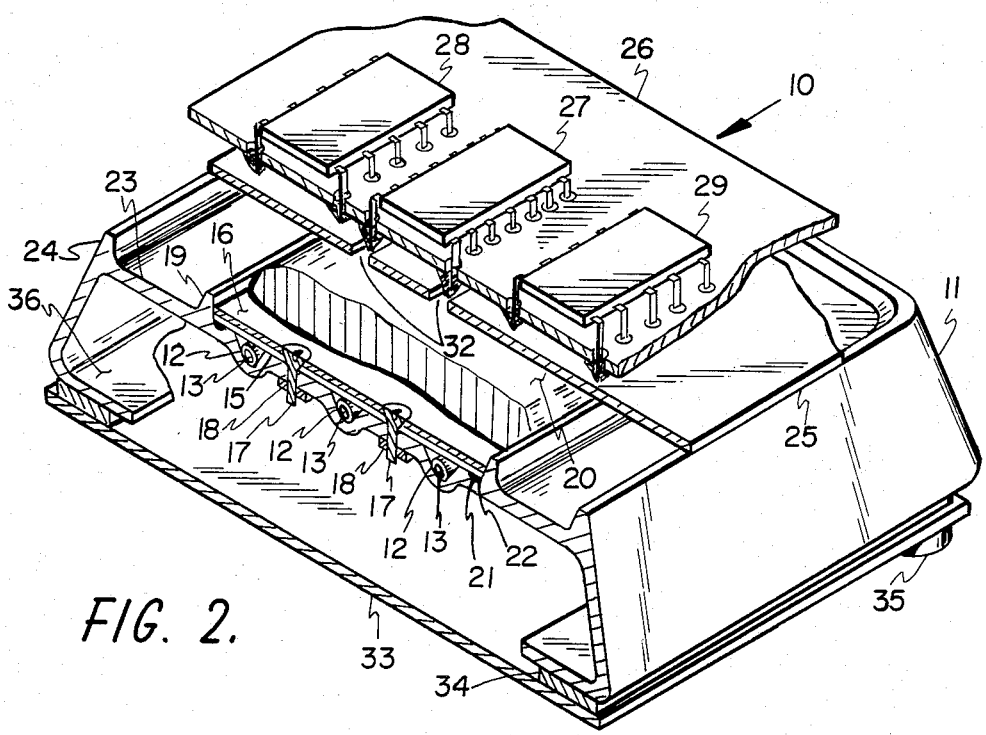
FIG. 2 is a sectional isometric view taken through plane A—A of FIG. 1. This view shows the solder pot with a printed circuit board and appropriate mask directly above the molten solder area.

Referring to FIG. 2, combination 10 shows the preferred embodiment. Base 11 is constructed of a non-wetting, thermally insulating material, preferrably ceramic. Slot 12 is cast into base 11 in a serpentine path (not shown) to provide a receptacle for coiled heating element 13. Electrical connection means (not shown) connect power cord 14 shown in FIG. 1 to the ends of heating coil 13 through holes (not shown) in base 11. The ground wire of power cord 14 may be attached to one of the attach screws 17 with nut 18 to maintain the molten solder 20 at electrical ground potential.

Insulation sheet 15 provides electrical insulation between hot plate 16 and heating element 13. Insulation sheet 15 is fabricated from high temperature electrical insulating material such as mica. Hot plate 16 is fabricated from a thermally conducting non-wetting material such as 303 stainless steel. Hot plate 16 is mechanically attached to base 11 by flat head screws 17 and nuts 18 thereby capturing the insulation sheet 15 and heating coil 13 in place within base 11.

Wall 19 is integrally cast in base 11 around the perimeter of hot plate 16 to provide containment for molten solder 20 on hot plate 16. Solder 20 is melted on hot plate 16 with sufficient depth to form a meniscus above the surface of wall 19. Wall 19 also provides the interior containment of recessed area 23. Wall 19 could alternately be formed as an extension of hot plate 16. The edges of hot plate 16 could be bent up (not shown) around the perimeter thereby forming a metal dish to contain molten solder 20. Groove 21 is also cast integrally in base 11 under the perimeter of hot plate 16. High temperature compound 22 such as commercially available silicon heat sink compound is placed inside groove 21 in contact with insulation sheet 15 to prevent molten solder 20, flux or soldering oil from leaking around hot plate 16 and shorting out heating element 13. The combination of groove 21 and compound 22 effectively provides a static seal. Wall 24 is integrally cast on the outer perimeter of base 11 top surface. Wall 24 provides the outer containment for recessed area 23. Recessed area 23 provides a space to catch and collect any molten solder 20 that may flow over wall 19. Any molten solder 20 flowing into recessed area 23 chills and solidifies thereby preventing any accidental burns to the operator.

The assembly of combination 10 is completed with subplate 33 attached to bottom surface 36 of base 11 with suitable means such as double sticky sponge tape 34. Rubber feet 35 are attached by suitable means such as adhesive to the bottom outer corners of subplate 33. Subplate 33 protects the electrical connections to power cord 14 inside base 11.

A thermostat (not shown) may be installed in a cavity (not shown) in base 11 under hot plate 16 to be wired in series with the power cord 14 and heater 13 thereby controlling the temperature of solder 20 within fixed preset limits.

Figure 3:
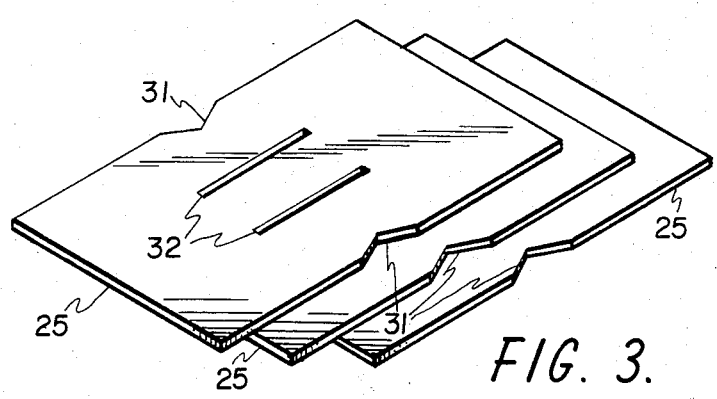
FIG. 3 is an isometric view of a stack of various precut masks.

Mask 25 is shown in FIG. 2 above molten solder 20 and in contact with the bottom surface of printed circuit board 26. The slots 32 in mask 25 are shown aligned with the pins of integrated circuit device 27. FIG. 3 shows a stack of masks 25 that may be precut with slots 32 to match the pin geometry of various devices. Mask 25 is made from a thin, high temperature non-wetting material. Stainless steel has been successfully used by curling (not shown) the inside edges of slots 32 up to contact the surface of board 26 around the edges of the device pins to be removed. This curling is necessary on a stiff material to minimize the gap between mask 25 and board 26 thereby preventing molten solder from being forced between the mask and board. The preferred material is TEFLON because it may be easily cut with a sharp knife to match a new device geometry. The preferred thickness of mask 25 is in the range of 0.002 to 0.007 inch. A thin flexible mask is preferred because the hydraulic force of the molten solder forces the mask in contact with the board around the perimeter of slots 32 thereby preventing solder from getting between the mask 25 and the board 26.

Notches 30 are integrally cast into base 11 as shown in FIG. 1. These notches 30 are intended to align with notches 31 in masks 25 shown in FIG. 3.

To use the apparatus, an operator first places a suitable mask 25 against the bottom surface of printed circuit board 26 in a manner such that slots 32 are aligned with the soldered pins of device 27 to be removed. The mask 25 may be attached to the board with suitable means such as clips (not shown) or tape (not shown) such as commercial masking tape. The mask 25 may also be coated with an adhesive layer (not shown) to allow it to self adhere to the printed circuit board 26.

The operator then holds the mask 25 and board 26 combination with both hands such that the middle finger of each hand is over one each of the notches 31 of mask 25. The board 26 and mask 25 are then lowered to the molten solder 20 while the two middle fingers are aligned with notches 30 in base 11. This technique aligns notches 31 with notches 30 and assures that slots 32 are over molten solder 20. After the board 26 and mask 25 are placed on the top of molten solder 20, hydraulic action forces solder through slots 32 in contact with the soldered pins of device 27. One hand may then be removed from board 26 to remove device 27 with an appropriate tool. As soon as device 27 is removed, board 26 with mask 25 should be removed from contact with molten solder 20 to minimize heat damage to the board.

Placing a new device in the board 26 is accomplished as follows. First, the device leads are bent or formed such that all leads will easily pass through the appropriate hole pattern in board 26. This may be done by doing a trial fit in a hole pattern that does not have solder in the holes and bending the individual leads as required, or the device may be held in a commercially available insertion tool. After the device is prepared, board 26 and mask 25 combination are again placed in contact with molten solder 20 such that molten solder contacts the bottom of the desired hole pattern. Heat transfer from molten solder 20 will melt the solder in the hole pattern within several seconds. The new device is then dipped in flux and its leads are pushed through the molten solder in the hole pattern. The board 26, mask 25 and new device are allowed to remain in contact with molten solder 20 for several seconds to allow solder to flow and wet the device leads. Board 26 and mask 25 are then removed from the solder and allowed to cool. The mask is removed from the board and the device change is complete.

I claim:

1. An apparatus for removing or replacing multipin devices in printed circuit boards comprising a solder pot, molten solder and flexible mask means; said flexible mask means fabricated with at least one precut hole or slot to expose the pins of the device being removed.

2. The apparatus of claim 1 wherein said flexible mask means is made of TEFLON sheet.

3. The apparatus of claim 1 wherein said solder pot is fabricated with a recessed area sorrounding the area of molten solder.

4. The apparatus of claim 1 wherein said solder pot is fabricated with a recessed area sorrounding the area of molten solder; notches are located on the sides of the recessed area; and the flexible mask means has notches cut in its sides to coincide with the notches on the sides of the recessed area.

5. An apparatus for removing or replacing multipin devices in printed circuit boards comprising a solder pot; molten solder; and a flexible mask means, said flexible mask means fabricated with at least one precut hole or slot to expose the pins of the device being removed, and with means for attaching said mask to the under side of said printed circuit board.

6. An apparatus for removing or replacing multipin devices in printed circuit boards comprising a ceramic base formed with a cavity for a heater; a heater with a flat plate placed inside said heater cavity; a flexible mask means cut with at least one hole; and solder melted on the exposed surface of said flat plate with sufficient depth to form a meniscus above the top surface of the walls of said cavity.

7. The apparatus of claim 6 wherein the ceramic base is also formed with a recessed area sorrounding the perimeter of said heater cavity.

8. The apparatus of claim 6 wherein the flexible mask means is made of TEFLON sheet in the range of 0.002 to 0.007 inch thick.

9. The apparatus of claim 6 wherein the heater cavity has space and provision for the installation of a thermostat and a thermostat is included to maintain the temperature of the molten solder within fixed preset limits.

* * * * *